United States Patent
Tasch et al.

(10) Patent No.: US 7,985,015 B2
(45) Date of Patent: Jul. 26, 2011

(54) LED SPOTLIGHT HAVING A FUNNEL-SHAPED LENS

(75) Inventors: Stefan Tasch, Jennersdorf (AT); Hans Hoschopf, Jennersdorf (AT); Peter Pachler, Graz-St. Peter (AT)

(73) Assignee: Tridonic Optoelectronics GmbH, Jennersdorf (AT)

( * ) Notice: Subject to any disclaimer, the term of this patent is extended or adjusted under 35 U.S.C. 154(b) by 181 days.

(21) Appl. No.: 11/632,096

(22) PCT Filed: May 25, 2005

(86) PCT No.: PCT/EP2005/005681
§ 371 (c)(1), (2), (4) Date: Jul. 26, 2007

(87) PCT Pub. No.: WO2006/005393
PCT Pub. Date: Jan. 19, 2006

(65) Prior Publication Data
US 2007/0279904 A1    Dec. 6, 2007

(30) Foreign Application Priority Data
Jul. 14, 2004 (DE) .................. 20 2004 011 015 U

(51) Int. Cl.
*F21V 5/00* (2006.01)
*F21V 7/09* (2006.01)

(52) U.S. Cl. .................. 362/555; 362/309; 362/311.02; 362/311.06

(58) Field of Classification Search .................. 362/555, 362/558, 247, 327, 309, 299, 310, 296.09, 362/311.02, 311.06, 311.11; 257/98
See application file for complete search history.

(56) References Cited

U.S. PATENT DOCUMENTS

| | | | |
|---|---|---|---|
| 1,726,379 A | | 8/1929 | Benford |
| 3,875,456 A | | 4/1975 | Kano et al. |
| 3,923,381 A | * | 12/1975 | Winston ........................ 359/852 |
| 4,009,394 A | | 2/1977 | Mierzwinski et al. |
| 4,143,394 A | | 3/1979 | Schöberl ........................ 357/72 |
| 5,084,804 A | * | 1/1992 | Schairer ........................ 362/459 |
| 5,555,161 A | * | 9/1996 | Roe et al. ........................ 362/555 |

(Continued)

FOREIGN PATENT DOCUMENTS
EP    1 418 628 A1    5/2004
(Continued)

OTHER PUBLICATIONS
International Search Report (German) issued Apr. 18, 2006 in connection with International Application No. PCT/EP05/005681.
(Continued)

*Primary Examiner* — Jong-Suk (James) Lee
*Assistant Examiner* — Peggy A. Neils
(74) *Attorney, Agent, or Firm* — Marshall, Gerstein & Borun LLP

(57) ABSTRACT

An LED spotlight has an arrangement having at least one LED, above which there is arranged a color conversion substance, and an optical system of a substantially transparent material, which directs incident light from the LED arrangement in the direction of an exit surface by means of total internal reflection. The base surface of the conical optical system may thereby have the shape of a polygon. The outer wall of the conical optical system may have at least in partial regions planar facets. The color conversion material may be provided in the shape of a cuboid above the LED arrangement.

9 Claims, 3 Drawing Sheets

U.S. PATENT DOCUMENTS

| | | | |
|---|---|---|---|
| 5,898,267 A * | 4/1999 | McDermott | 313/512 |
| 6,560,038 B1 * | 5/2003 | Parkyn et al. | 359/726 |
| 6,828,590 B2 * | 12/2004 | Hsiung | 257/79 |
| 6,909,123 B2 * | 6/2005 | Hayashimoto et al. | 257/98 |
| 7,021,797 B2 * | 4/2006 | Miñano et al. | 362/355 |
| 7,049,740 B2 * | 5/2006 | Takekuma | 313/501 |
| 7,152,985 B2 * | 12/2006 | Benitez et al. | 359/857 |
| 7,172,319 B2 * | 2/2007 | Holder et al. | 362/341 |
| 7,329,982 B2 * | 2/2008 | Conner et al. | 313/498 |
| 7,347,603 B2 * | 3/2008 | Ikeda et al. | 362/555 |
| 7,467,885 B2 * | 12/2008 | Grotsch et al. | 362/555 |
| 7,581,860 B2 * | 9/2009 | Bogner et al. | 362/509 |
| 2002/0080622 A1 * | 6/2002 | Pashley et al. | 362/555 |
| 2002/0085390 A1 * | 7/2002 | Kiyomoto et al. | 362/555 |
| 2002/0185966 A1 | 12/2002 | Murano | 313/501 |

FOREIGN PATENT DOCUMENTS

| | | |
|---|---|---|
| EP | 1 427 029 A2 | 6/2004 |
| JP | 58-204575 | 11/1983 |
| WO | WO 02/50472 | 6/2002 |

OTHER PUBLICATIONS

International Preliminary Report on Patentability (German) issued Oct. 12, 2006 in connection with International Application No. PCT/EP05/005681.

Schlotter et al. "Fabrication and characterization of GaN/InGaN/AlGaN double heterostructure LEDs and their application in luminescence conversion LEDs," Materials Science and Engineering B, Elsevier Sequoia, Lausanne, CH, Bd. 59, Nr. 1-3, p. 390-394 (May 6, 1999).

English translation of International Search Report originally issued Apr. 18, 2006 in connection with International Application No. PCT/EP05/005681.

English translation of International Preliminary Report on Patentability orignially issued Oct. 12, 2006 in connection with International Application No. PCT/EP05/005681.

* cited by examiner

LED SPOTLIGHT HAVING A FUNNEL-SHAPED LENS

BACKGROUND OF THE INVENTION

1. Field of the Invention

The invention relates to an LED spotlight.

2. Related Technology

The background of the invention is the field of light emitting diodes and in particular the field of "white" light emitting diodes (LEDs). In accordance with the state of the art, for the generation of white light by means of light emitting diodes, colored, in particular blue light is generated by means of color conversion or by means of mixing of light components from LEDs of different colors. For example, the white light can arise through mixing of blue light generated by an LED chip with yellow light, which upon passage of the blue light through a color conversion material surrounding the LEDs is generated from a part of the blue light.

Due to the characteristics of the color conversion materials and the technical restrictions in the production of LEDs there thereby often arise differently colored regions of the color conversion layer arranged above the LEDs, which through imaging of the same lead to a nonhomogeneous color distribution. This is particularly the case with conventional refraction lenses. With refraction lenses there arises in particular with narrowly radiating LEDs the difficulty of mixing the blue light with the yellow converted light over the entire emission range such that homogenous white light is emitted.

In the generation of white light starting from blue LEDs it is difficult to so mix the blue color with the yellow converted color over the entire radiation breadth that homogenous white light is emitted.

From WO 02/50572 A1 there is known an LED spotlight arrangement having an inwardly open reflector. Since at the floor of the reflector there are arranged LEDs of different colors, no color conversion is necessary.

SUMMARY OF THE INVENTION

The invention improves the emission characteristics of LED spotlights.

In accordance with a first aspect of the present invention there is thus provided an LED spotlight, which has an arrangement having at least one LED and a conical optical system of an in substance transparent solid material, which widens away from the LED arrangement and directs the light from the LED arrangement, by means of total internal reflection, in the direction of an exit surface of the conical optical system. Thus, "indirect" light, i.e. light that has been totally reflected at the side surface (boundary layer to the surrounding air) of the conical optical system thus mixes with the light component which runs without reflection "directly" through the conical optical material to the exit surface.

The base surface of the conical optical system may have the shape of a polygon, circle, or ellipse.

The side walls of the conical optical system may have at least in partial regions planar facets.

Above the LED arrangement, i.e. between the LED arrangement and the exit surface, there is arranged a color conversion material. The color conversion material may thereby in particular be arranged in the form of a cuboid solid.

In the case of a plurality of LEDs, these may be of the same color or also of different colors.

The LED arrangement may be placed flush in a carrier, which ends flush with the base plane of the conical optical system.

BRIEF DESCRIPTION OF THE DRAWINGS

Further advantages, features and characteristics of the invention are explained in more detail below with reference to the Figures of the accompanying drawings.

DETAILED DESCRIPTION

Figure 1:
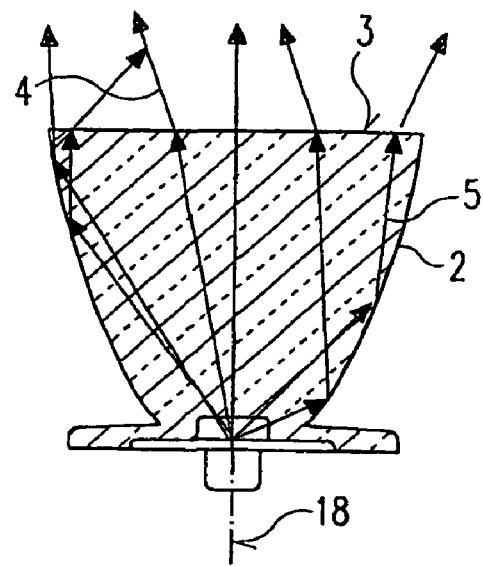
FIG. 1 shows a schematic view of the beam path in a conical optical system in accordance with the invention.

As can be seen in FIG. 1, in accordance with the invention, there is provided for an LED spotlight a funnel-shaped lens in the form of a conical optical system 1 of a substantially transparent solid material, which has side walls 2 and an exit surface 3, which stands perpendicularly to the symmetry axis of the conical optical system 1. The material of the conical optical system may have for example a refractive index of 1.4 to 1.6, in particular 1.5 to 1.55.

At the boundary layer from the conical optical system to the surrounding air, light incident from the interior is totally reflected, so that it does not emerge at the side walls of the conical optical system. Since, rather, it is incident on the exit surface of the conical optical system in a substantially more oblique angle, it is there not reflected, rather merely refracted away from the normal to the exit surface.

By means of the acute angle, which the outer surface of the conical optical system includes with the axis of symmetry, it is ensured that the light from the LED arrangement is incident at an angle which is smaller than or the same as the boundary angle for total internal reflection. Since this boundary angle $\alpha$ is, in accordance with the following equation $$\sin(\alpha) = n1/n2$$

a function of the refractive index n2 of the material of the conical optical system (and of the refractive index n1 of the surrounding air), the possible path of the outer surface of the conical optical system depends upon the refractive index of the material selected for the conical optical system.

In this respect it is advantageous if the angle formed between the surface with the axis of symmetry decreases in value while the distance from the LED arrangement increases.

Figure 3:
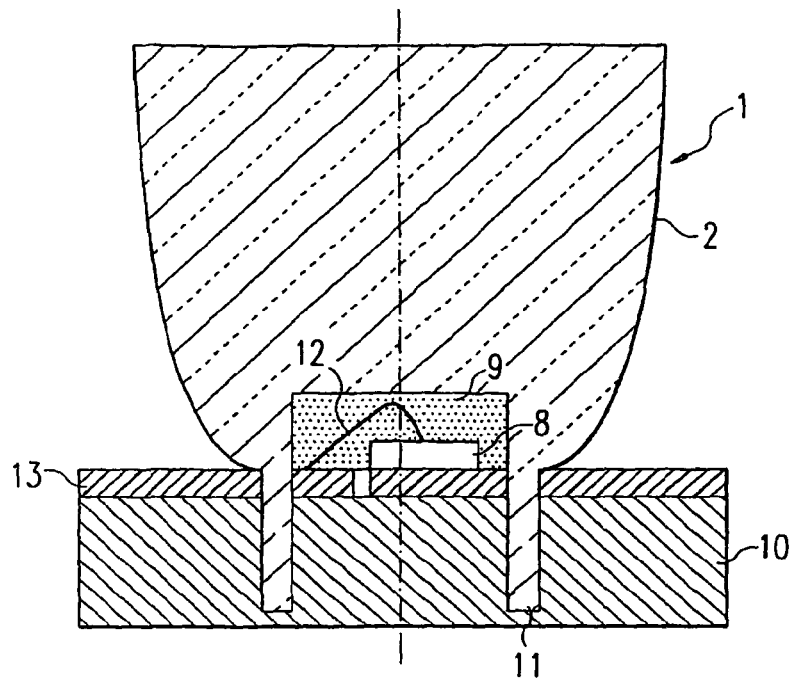
FIG. 3 shows a schematic sectional view of an exemplary embodiment of an LED spotlight in accordance with the invention with LED chip in place.
Figure 4:
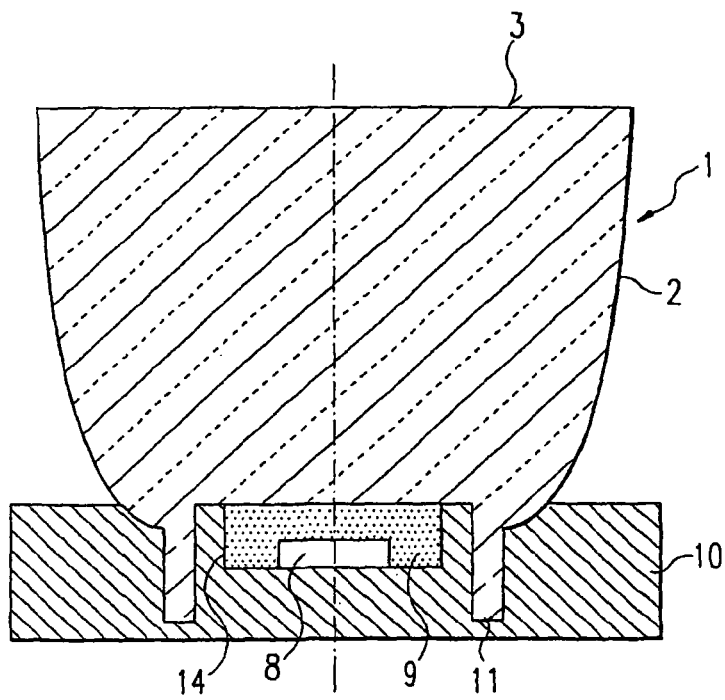
FIG. 4 shows a further exemplary embodiment of an LED spotlight in accordance with the invention.

In the region having lesser cross-section of the conical optical system 1 there is provided an LED light source, for example an LED chip, which is illustrated in FIGS. 3 and 4 and will be explained below with reference to these Figures. The LED chip has an LED arrangement with one or more LEDs.

From this LED chip light 4 can radiate-directly in the direction of the exit surface 3.

Indirect light, which in contrast is incident on the boundary surface of the conical optical system 1, is there totally reflected due to the appropriately selected refractive characteristics and the angle of incidence, and thus directed into the region of the exit surface 3.

Figure 2:
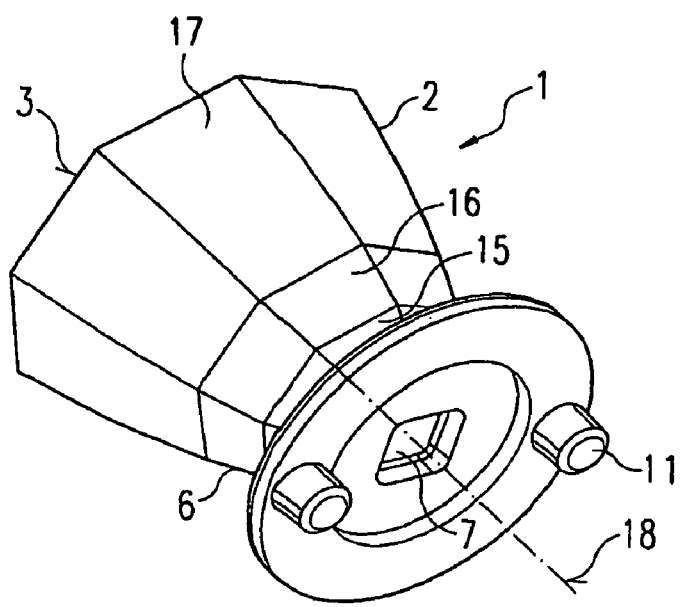
FIG. 2 shows a perspective view of a funnel-shaped lens in accordance with the invention.

As can be seen in FIG. 2, the side walls 2 of the conical optical system 1 may at least partially have planar facets 6.

In the lower region of the conical optical system 1 there is provided an opening for placement of an LED chip. Further, the underside of the conical optical system 1 may have attachment extensions 11 by means of which the conical optical system 1 can be positioned on a carrier and, if applicable, mounted.

The LED spotlight is completely filled by the material of the conical optical system, the color conversion material and the LED light source, i.e. filled without empty regions or air inclusions.

In the exemplary embodiment of FIG. 3, the conical optical system 1 is emplaced and positioned in a carrier 10 by means of the attachment extensions 11. On the upper side of the carrier 10 there is provided a circuit board 13. In the interior of the conical optical system 1 an LED chip 8 is arranged which is at its underside insulated with respect to the circuit board 13, but for example appropriately electrically contacted with this by means of bonding wires 12. Above the LED chip 8 there is applied color conversion material 9 in the form of a cuboid solid.

The exemplary embodiment of FIG. 4 differs from that of FIG. 3 in that the LED chip 8 and the color conversion material 9, again in the shape of a cuboid solid, is emplaced in a depression 14 in the carrier 10 to be flush therewith.

In accordance with the invention the mixing of the light color which corresponds to the emission color of the LED chip 8 with the light color that arises through the conversion in the color conversion material 9 is decisively improved. Thereby, the improvement of the mixing is effected in particular through at least one of the following mechanisms:

there is employed a conical optical system 1 with which the light from the side total internal reflection regions and the light emitted directly via the plane cover surface are superimposed. Through this, via a suitable conformation of the side conical walls 2 there is achieved a first mixing of the light.

The mixing can be further improved if the cone is divided into a plurality of segments, which each itself already generates the desired emission. Through the superimposition of the emission of the individual cone regions (see for example the facets 6 in FIG. 2) a further mixing of the light is achieved. The "cone" has in this case a polygonal base surface.

Through additionally applied facets 6 there is attained a further improvement of the mixing of the light; this provides however only mixing in the smaller spatial angle ranges. Further below, the angular dispositions of these facets will be further specified.

Through the adaptation of the geometry of the color conversion material it is likewise provided that the emission of the light into the various regions varies as little as possible. Further, through this the surface color of the color conversion material remains of the same kind within the technically possible limits.

With regard to the angular disposition of the facets in the conical optical system the following ranges are advantageous:

1. Light rays from an assumed point light source in the centre of the chip surface are sent out in an angular range from 0 to 28° (in the material) directly outwardly, i.e. to the exit surface 3.

2. In an angular range from 28 to 40° they experience total internal reflection at the inner side of the conical optical system 1 from 5° to the axis of symmetry of the conical optical system up to 0°.

3. In an exit region from 40 to 55° they experience total internal reflection from 0 degrees to 5° to the axis of symmetry and from 55 to 75° they experience a total internal reflection from 5° to the axis to 0°.

The superimposition of the emissions from these different regions thus yields the homogenous mixing. The three mentioned zones can be formed in the conical optical system 1 by means of side walls 2 having circular arc or having tangential transition, as is schematically represented in FIG. 2. Instead of the tangential transition, there may also be present an edge.

With 15 there is thereby designated the circular arc of the planar facets, which totally reflect the light beams having an exit range from 55° to 75°. With 16 there is designated the circular arc of the planar facets which totally reflect the light having an exit angle from 40° to 55°. Finally, with 17 there is designated the circular arc of the planar facets which totally reflect light in the range from 28 to 40. As mentioned, light of an exit angle of 0 to 28°, always measured with respect to the axis of symmetry 18, emerges directly into the exit surface 3.

The solid cuboid form of the color conversion material illustrated in FIGS. 3 and 4 makes possible a relatively slight color variance at the surface of the color conversion material. An exact relative positioning of the LED chip, of the color conversion medium and of the conical optical system can be facilitated in that the contour of the color conversion material is defined in shape by means of the underside of the conical optical system.

The conical optical system may be attached with the LED carrier 10 in various manners. For example, the LED chip can be emplaced in the conical optical system. The conical optical system can either be emplaced in the carrier as shown in FIG. 4 and/or be adhesively connected ultrasonically welded. Alternatively to this, the conical optical system can also be so broadened at the base that it can be placed directly on the carrier (see FIGS. 2 and 3). In the latter case the positioning can preferably effected by means of the illustrated small legs 11, with which the conical optical system can be placed in bores (see FIGS. 3 and 4 of the carrier 10.

Figure 5:
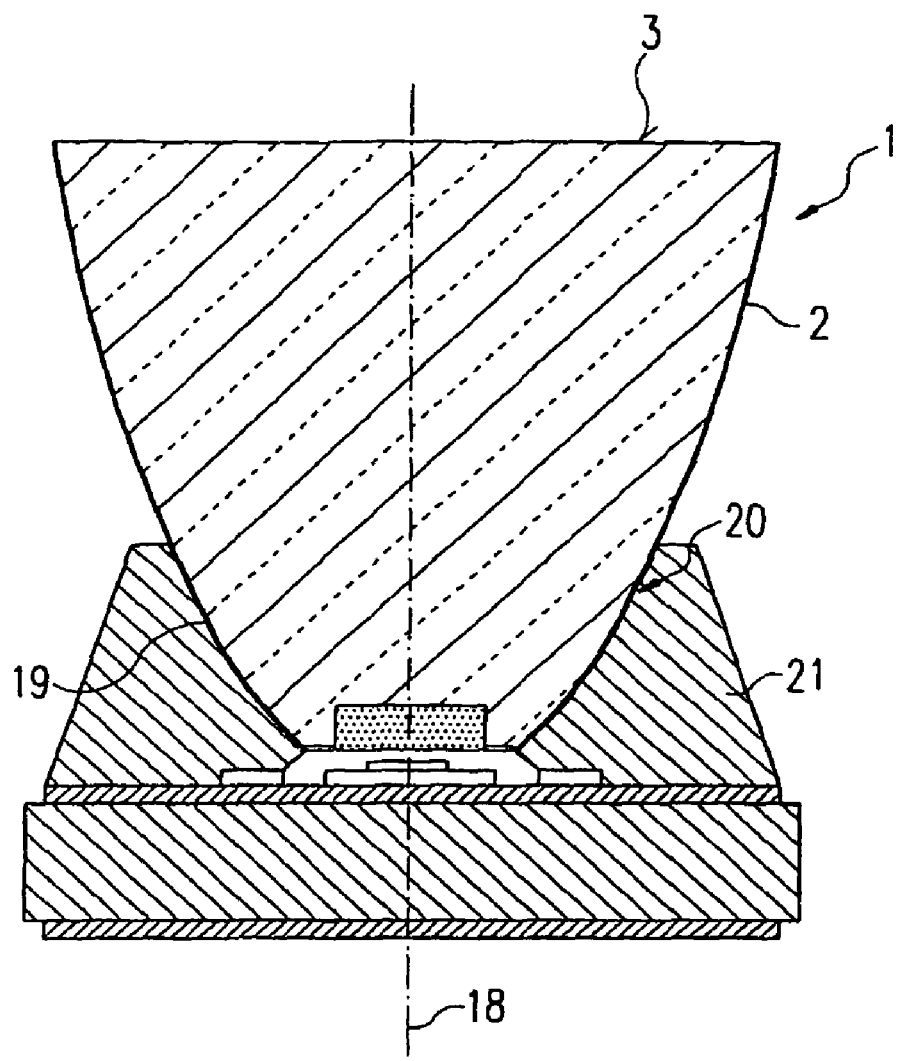
FIG. 5 shows an exemplary embodiment having a conical optical system which is partially mirrored.

FIG. 5 shows an exemplary embodiment in the case of which, for improvement of the efficiency of the total internal reflection, the outer surface of the conical optical system is at least partially mirrored, for example through a metal layer 19 externally applied. This metal layer represents only one possibility for how a reflector can supplement the total internal reflection.

Through the provision of such a reflector 19 at least in a part of the conical optical system, the effect of total internal reflection can in this region even be totally dispensed with, so that the LED spotlight in this region can be provided as shown in FIG. 5. For example, the LED spotlight may in this region of the outer surface of the conical optical system be connected by adhesion 20 with a carrier 21.

As already mentioned, the generation of white light, starting from blue or ultraviolet LEDs, can be provided by means of a color conversion process of luminophors, which are arranged directly above the LED chip. These luminophores are embedded in a transparent, thermally and light stable matrix such as epoxide, acrylate or silicones. Alternatively to this, the color conversion layer may also be directly applied to the LED chip. The attachment of the conical optical system to the substrate (carrier) may be effected by means of adhesion or through welding or any mechanical attachment. As lens material there are preferably put to use highly transparent plastics such as for example polycarbonate, PMMA, PMMI, COC, COP or, however, also glass.

LIST OF REFERENCE SIGNS 1. funnel-shaped lens (conical optical system)
2. transparent side wall
3. exit surface
4. direct light component
5. indirect (totally reflected light component)
6. facet
7. opening for LED die
8. LED die (LED chip) having one or more LEDs
9. color conversion material
10. carrier
11. attachment extension ("lens leg")
12. electrical contacting
13. circuit board
14. depression in carrier
15, 16, 17: circular arc sections
18. axis of symmetry of the optical system
19. partial mirroring
20. adhesion
21. fitting carrier

The invention claimed is:

1. LED spotlight, comprising;
an LED arrangement having at least one LED, above which there is arranged a color conversion substance, and
a conical optical system of a substantially transparent material, said conical optical system having an outer surface and an exit surface, and said conical optical system defining an axis of symmetry,
wherein the LED arrangement is so arranged with reference to the conical optical system that a part of light emitted from the LED arrangement is incident directly on the outer surface of the conical optical system and from there is directed in the direction of the exit surface by means of total internal reflection, which another part of the light from the LED arrangement passes directly to the exit surface without reflection, and
wherein the outer surface forms an angle with the axis of symmetry that decreases in value while the distance from the LED arrangement increases.

2. LED spotlight according to claim 1, wherein the base surface of the conical optical system has the shape of a polygon.

3. LED spotlight according to claim 1, wherein the outer wall of the conical optical system has at least in partial regions planar facets.

4. LED spotlight according to claim 1, wherein the color conversion material is provided in the shape of a cuboid above the LED arrangement.

5. LED spotlight according to claim 1, wherein the LED arrangement has a plurality of LEDs of the same color.

6. LED spotlight according to claim 1, wherein the LED arrangement is emplaced flush in a carrier which forms a base surface of the conical optical system.

7. LED spotlight according to claim 1, wherein the outer wall of the conical optical system has at least two circular arc regions which in each case comprises planar facets inclined with respect to the axis of symmetry of the conical optical system.

8. LED spotlight according to claim 1, wherein the outer surface of the conical optical system is at least partially mirrored.

9. LED spotlight according to claim 8, wherein, the conical optical system is mounted in the region of the mirroring.

* * * * *